US012650474B2

(12) United States Patent
Shiraga et al.

(10) Patent No.: US 12,650,474 B2
(45) Date of Patent: Jun. 9, 2026

(54) STORAGE BATTERY DIAGNOSING SYSTEM

(71) Applicant: Mitsubishi Electric Corporation, Tokyo (JP)

(72) Inventors: Sho Shiraga, Tokyo (JP); Tomoki Takegami, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 428 days.

(21) Appl. No.: 18/271,472

(22) PCT Filed: Feb. 25, 2021

(86) PCT No.: PCT/JP2021/007030

§ 371 (c)(1),
(2) Date: Jul. 10, 2023

(87) PCT Pub. No.: WO2022/180732

PCT Pub. Date: Sep. 1, 2022

(65) Prior Publication Data

US 2024/0053408 A1     Feb. 15, 2024

(51) Int. Cl.
*G01R 31/396* (2019.01)
*G01R 31/36* (2020.01)
(Continued)

(52) U.S. Cl.
CPC ....... *G01R 31/396* (2019.01); *G01R 31/3648* (2013.01); *G01R 31/367* (2019.01);
(Continued)

(58) Field of Classification Search
CPC .............. G01R 31/396; G01R 31/3648; G01R 31/367; G01R 31/3842; G01R 31/392; G06F 17/18
See application file for complete search history.

(56) References Cited

U.S. PATENT DOCUMENTS

2002/0011822 A1     1/2002   Sakai et al.
2012/0116701 A1*    5/2012   Yuasa ................... H01M 10/44
                                                      324/427
(Continued)

FOREIGN PATENT DOCUMENTS

| CN | 112240986 A | * 1/2021 | .......... G01R 31/396 |
| JP | 3559900 B2 | 9/2004 | |
| JP | 6323639 B2 | 5/2018 | |

OTHER PUBLICATIONS

Machine translation for CN-112240986-A, downloaded Jan. 23, 2026 (Year: 2026).*

(Continued)

*Primary Examiner* — John C Kuan
(74) *Attorney, Agent, or Firm* — XSENSUS LLP

(57) ABSTRACT

An ammeter measures current when a storage battery having a plurality of single batteries connected in series is charged or discharged. A voltmeter measures total voltage of the storage battery. A calculation device calculates dV/dt obtained by differentiating the total voltage with respect to time on the basis of a relationship between the total voltage and charging time or discharging time, separates a characteristic peak obtained by a dV/dt curve into peaks for the respective single batteries, and diagnoses soundness of the storage battery on the basis of the separated peaks.

9 Claims, 15 Drawing Sheets

(51) Int. Cl.

| | |
|---|---|
| *G01R 31/367* | (2019.01) |
| *G01R 31/3842* | (2019.01) |
| *G01R 31/392* | (2019.01) |
| *G06F 17/18* | (2006.01) |

(52) U.S. Cl.
CPC ....... *G01R 31/3842* (2019.01); *G01R 31/392* (2019.01); *G06F 17/18* (2013.01)

(56) References Cited

U.S. PATENT DOCUMENTS

| | | | |
|---|---|---|---|
| 2017/0259687 A1* | 9/2017 | Chikkannanavar ... | B60L 3/0046 |
| 2021/0296912 A1* | 9/2021 | Cho ..................... | H02J 7/0024 |

OTHER PUBLICATIONS

Xue et al., "Fault diagnosis and abnormality detection of lithium-ion battery packs based on statistical distribution" Journal of Power Sources 482 (2021) 228964 (Year: 2021).*

International Search Report and Written Opinion mailed on May 18, 2021, received for PCT Application PCT/JP2021/007030, filed on Feb. 25, 2021, 11 pages including English Translation.

\* cited by examiner

START $$fcell_1(t) = A_1 \exp\left[-\frac{(t-\mu_1)^2}{2\sigma_1^2}\right] \cdots \text{EXPRESSION 7}$$

Figure 9:
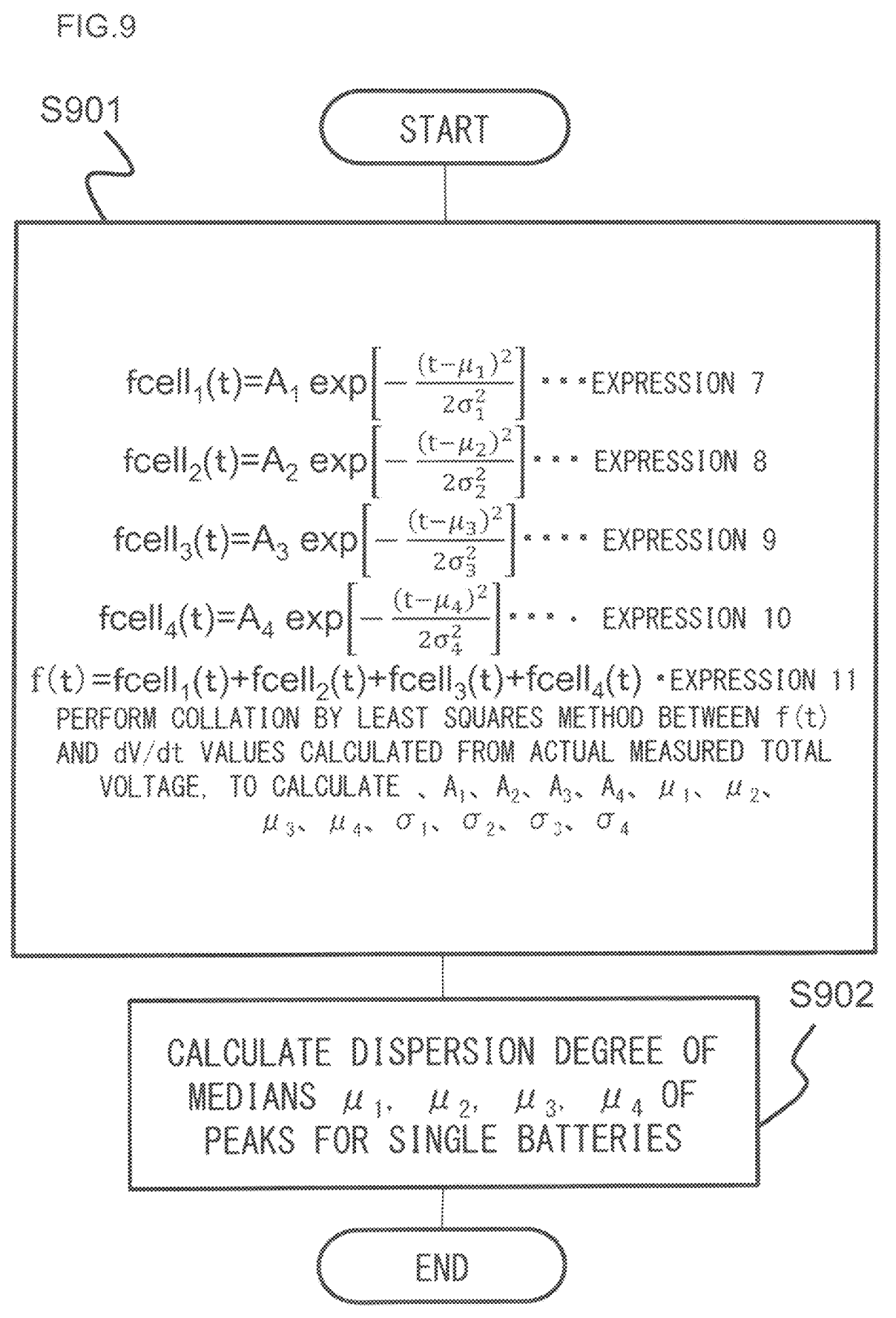

$$fcell_2(t) = A_2 \exp\left[-\frac{(t-\mu_2)^2}{2\sigma_2^2}\right] \cdots \text{EXPRESSION 8}$$

$$fcell_3(t) = A_3 \exp\left[-\frac{(t-\mu_3)^2}{2\sigma_3^2}\right] \cdots \text{EXPRESSION 9}$$

$$fcell_4(t) = A_4 \exp\left[-\frac{(t-\mu_4)^2}{2\sigma_4^2}\right] \cdots \text{EXPRESSION 10}$$

$$f(t) = fcell_1(t) + fcell_2(t) + fcell_3(t) + fcell_4(t) \cdot \text{EXPRESSION 11}$$

PERFORM COLLATION BY LEAST SQUARES METHOD BETWEEN $f(t)$ AND $dV/dt$ VALUES CALCULATED FROM ACTUAL MEASURED TOTAL VOLTAGE, TO CALCULATE $A_1$, $A_2$, $A_3$, $A_4$, $\mu_1$, $\mu_2$, $\mu_3$, $\mu_4$, $\sigma_1$, $\sigma_2$, $\sigma_3$, $\sigma_4$

S902

CALCULATE DISPERSION DEGREE OF MEDIANS $\mu_1$, $\mu_2$, $\mu_3$, $\mu_4$ OF PEAKS FOR SINGLE BATTERIES

END

STORAGE BATTERY DIAGNOSING SYSTEM

CROSS-REFERENCE TO RELATED APPLICATION

The present application is based on PCT filing PCT/JP2021/007030, filed Feb. 25, 2021, the entire contents of which are incorporated herein by reference.

TECHNICAL FIELD

The present disclosure relates to a storage battery diagnosing system.

BACKGROUND ART

In a conventional storage battery diagnosing system, in order to diagnose soundness of a storage battery having a plurality of storage batteries connected in series, the voltages, the temperatures, the battery capacities, and the internal resistances of all the storage batteries composing the storage battery are measured and the total voltage is measured, thereby whether or not there is abnormality is determined. For example, in Patent Document 1, on the basis of the voltage values, the cell temperatures, the battery capacities, the internal resistance values, and the like of battery cells detected by respective cell monitoring units, a difference between the maximum value and the minimum value of the voltages, a difference between the maximum value and the minimum value of the cell temperatures, a difference between the maximum value and the minimum value of the battery capacities, a difference between the maximum value and the minimum value of the internal resistance values, and the like of all the battery cells, are calculated. Then, if any of the calculation results is outside a range of an abnormality determination value set for each of the voltage value, the cell temperature, the battery capacity, and the internal resistance value, variations have occurred in performances of the battery cells composing a battery pack and therefore the battery pack is determined to have abnormality.

PRIOR ART DOCUMENT

Patent Document

Patent Document 1: Japanese Patent No. 6323639

SUMMARY OF THE INVENTION

Problems to be Solved by the Invention

In the storage battery diagnosing system as described above, it is required to provide large number of voltmeters, ammeters, temperature sensors, and the like on a module basis or a single battery basis. Therefore, there is a problem that maintenance for sensors and the like is cumbersome and that economic loss and the need for ensuring reliability occur due to a large number of components.

The present disclosure has been made to solve the above problem, and an object of the present disclosure is to provide a device for easily diagnosing soundness of a storage battery having a plurality of single batteries connected in series.

Means to Solve the Problem

A storage battery diagnosing system according to the present disclosure includes an ammeter for measuring current when a storage battery having a plurality of single batteries connected in series is charged or discharged; a voltmeter for measuring total voltage of the storage battery; and a calculation device which calculates dV/dt obtained by differentiating the total voltage with respect to time on the basis of a relationship between the total voltage and charging time or discharging time, separates a characteristic peak obtained from a dV/dt curve into peaks for the respective single batteries, and diagnoses soundness of the storage battery on the basis of the separated peaks.

Another storage battery diagnosing system according to the present disclosure includes an ammeter for measuring current when a storage battery having a plurality of single batteries connected in series is charged or discharged; a voltmeter for measuring total voltage of the storage battery; and a calculation device which calculates dV/dQ obtained by differentiating the total voltage with respect to an electric capacity on the basis of a relationship between the total voltage and the electric capacity, separates a characteristic peak obtained from a dV/dQ curve into peaks for the respective single batteries, and diagnoses soundness of the storage battery on the basis of the separated peaks.

Effect of the Invention

The storage battery diagnosing system according to the present disclosure can easily diagnose soundness of a storage battery having a plurality of single batteries connected in series.

BRIEF DESCRIPTION OF THE DRAWINGS

FIG. 9 is a flowchart showing operations in step S803 and step S804 shown in FIG. 8.

EMBODIMENTS FOR CARRYING OUT THE INVENTION

Embodiment 1

Figure 1:
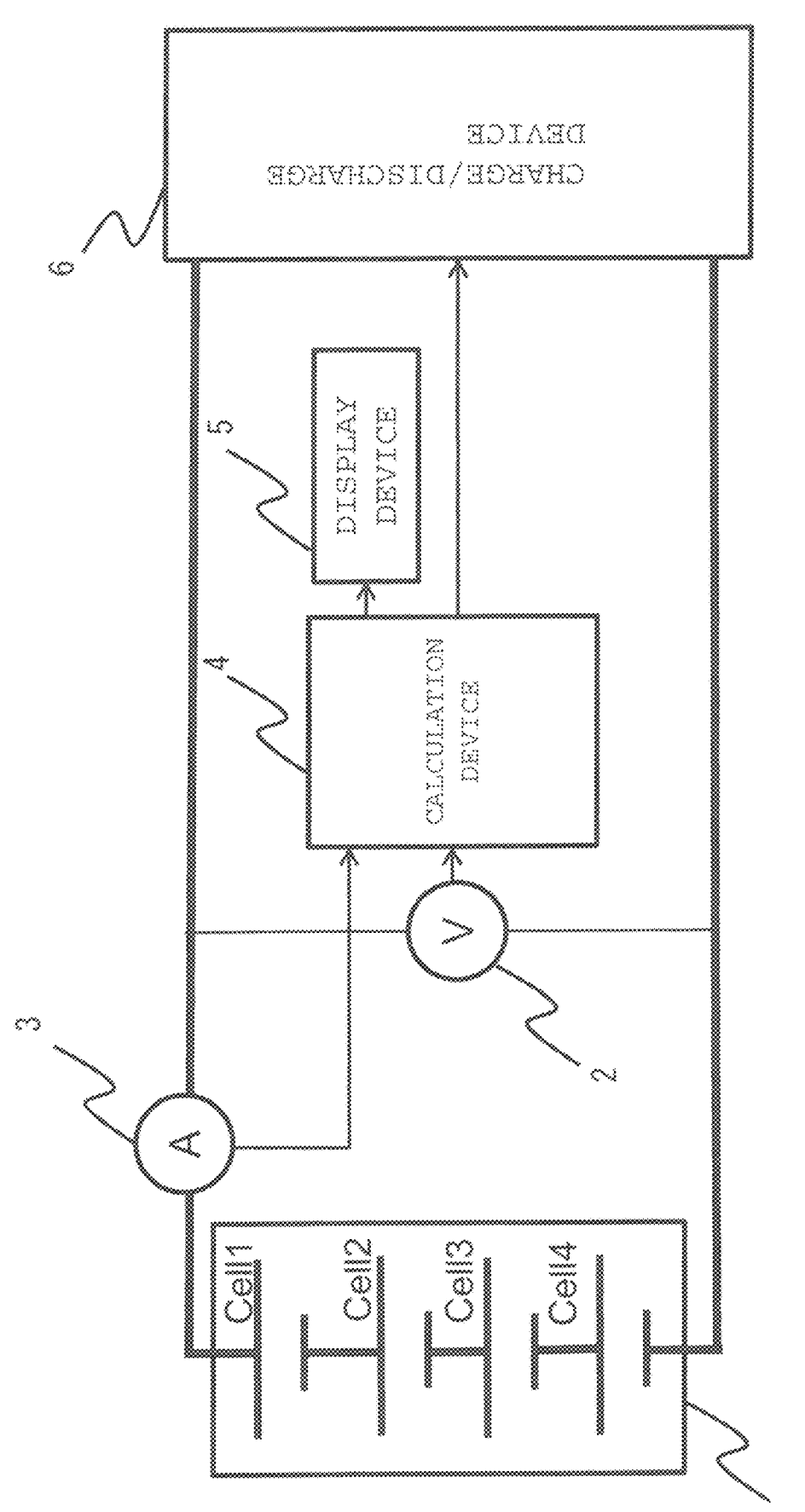
FIG. 1 is a schematic diagram showing a storage battery diagnosing system according to embodiment 1.

The present embodiment relates to a device for diagnosing soundness of a storage battery having a plurality of single batteries connected in series. FIG. 1 is a schematic diagram showing the storage battery diagnosing system according to embodiment 1. In FIG. 1, a storage battery 1 is formed by connecting, in series, four single batteries cell1, cell2, cell3, cell4 that are lithium ion batteries. Total voltage of the storage battery 1 having the four single batteries connected in series is measured by a voltmeter 2, and current thereof is measured by an ammeter 3. On the basis of the values of the total voltage, the current, and time, a calculation device 4 diagnoses soundness of the storage battery. Then, the diagnosis result is displayed on a display device 5. In addition, the diagnosis result is sent to a charge/discharge device 6 and is used as a determination reference for continuation of charging, thereby charging/discharging of the storage battery is controlled.

Figure 2:
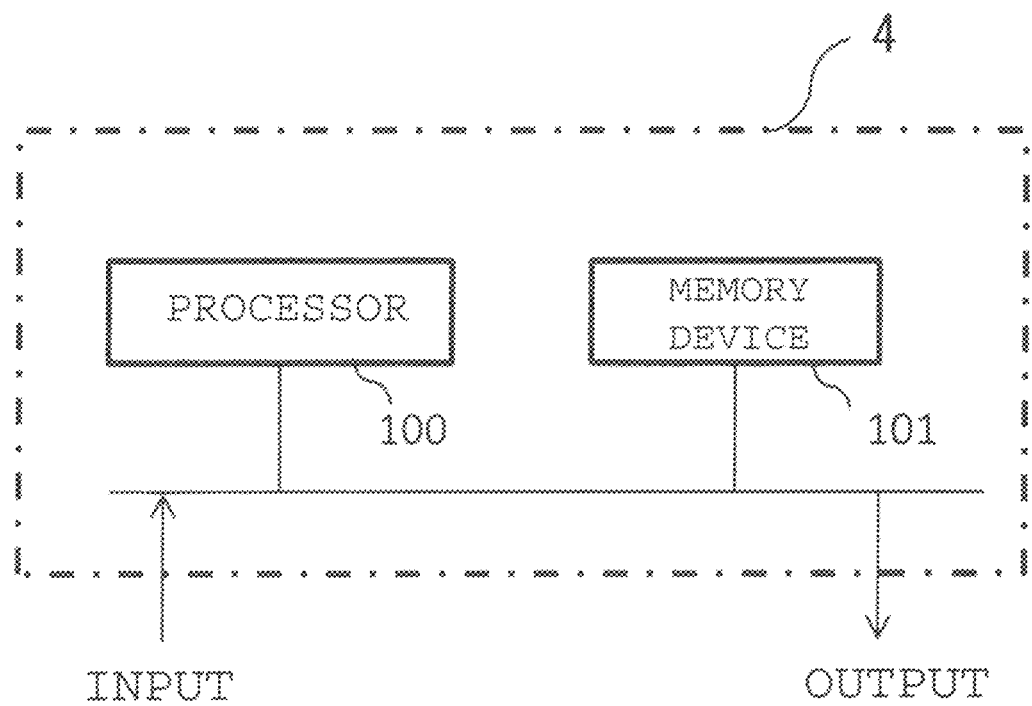
FIG. 2 is a block diagram showing an example of the hardware configuration of a calculation device in the storage battery diagnosing system according to embodiment 1.

FIG. 2 is a block diagram showing an example of the hardware configuration of the calculation device 4. The hardware of the calculation device 4 includes a processor 100 and a memory device 101. Although not shown, the memory device 101 is provided with a volatile memory device such as a random access memory and a nonvolatile auxiliary memory device such as a flash memory. Instead of the flash memory, an auxiliary memory device of a hard disk may be provided. The processor 100 executes a program inputted from the memory device 101. In this case, the program is inputted from the auxiliary memory device to the processor 100 via the volatile memory device. The processor 100 may output data such as a calculation result to the volatile memory device of the memory device 101, or may store such data into the auxiliary memory device via the volatile memory device. The processor 100 reads and executes the program stored in the memory device 101, to execute various functions described below.

Figure 3:
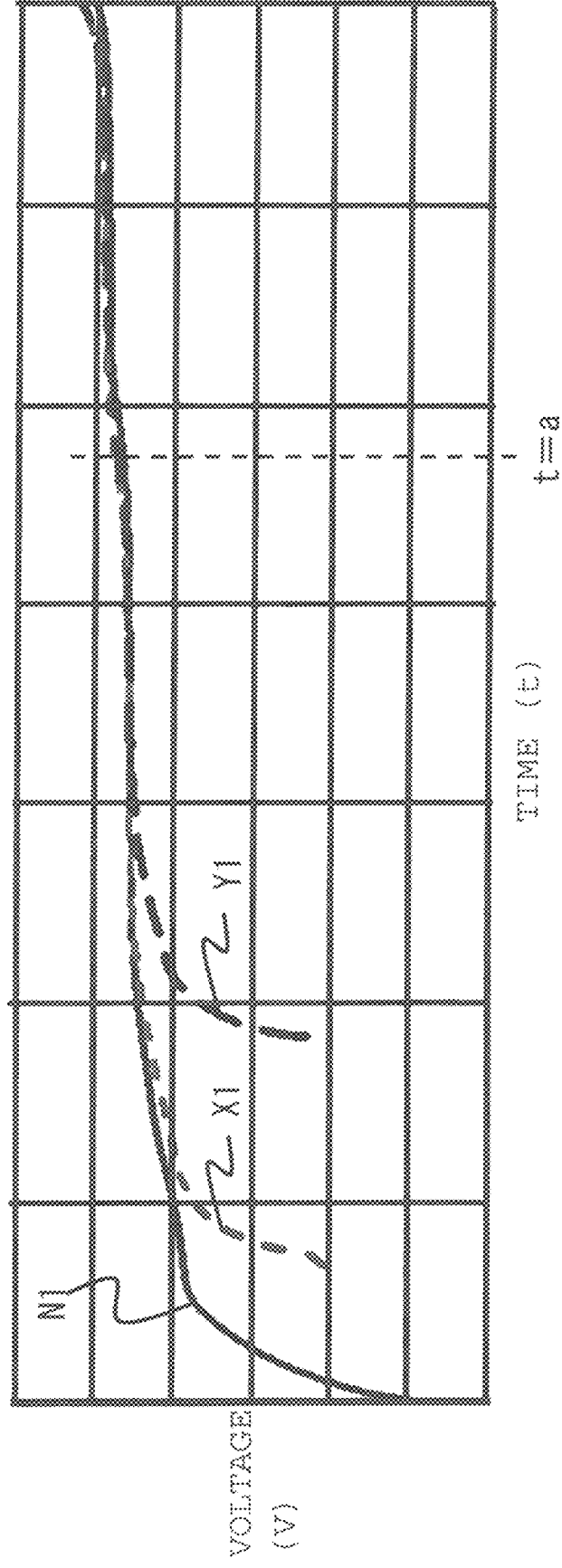
FIG. 3 is a diagram showing the relationship between time and change in total voltage when charging was performed at constant current, in a storage battery having four batteries connected in series, according to embodiment 1.

FIG. 3 shows the relationship between time (t) and change in total voltage when charging was performed at constant current in the storage battery 1 having the four single batteries cell1, cell2, cell3, cell4 connected in series, and the current value during charging was set to be sufficiently small. In FIG. 3, N1 indicates a case of a brand-new product, X1 indicates a case after X cycles (charging and discharging were repeated X times), and Y1 indicates a case after Y cycles (X<Y). By setting the current value so as to be sufficiently small during charging, resistance loss due to the internal resistance of the storage battery and the resistance of the circuit can be reduced. Therefore it is possible to measure potential change unique to each electrode material used in the storage battery. The current value during charging is appropriately selected in accordance with the internal resistance of the storage battery or the resistance of the circuit.

In FIG. 3, the case in which the storage battery was a brand-new product (N1), and the cases in which a charge-discharge cycle at the set current value was performed for X cycles and Y cycles (X<Y), are shown. And changes in total voltages when charging was performed at the sufficiently small current value in order to confirm capacities, are shown. Since the charging for confirming capacities is performed at constant current, plotting may be performed by using the electric capacity (=current×time) on the horizontal axis, although the horizontal axis indicates time (second) here. In FIG. 3, the charge finish times for N1, X1, and Y1 are shown so as to be aligned. As is found from FIG. 3, as the number of charge-discharge cycles increases from the brand-new product to X cycles and then Y cycles, the charging period is shortened and thus the electric capacity in which charging can be performed is reduced.

Figure 4:
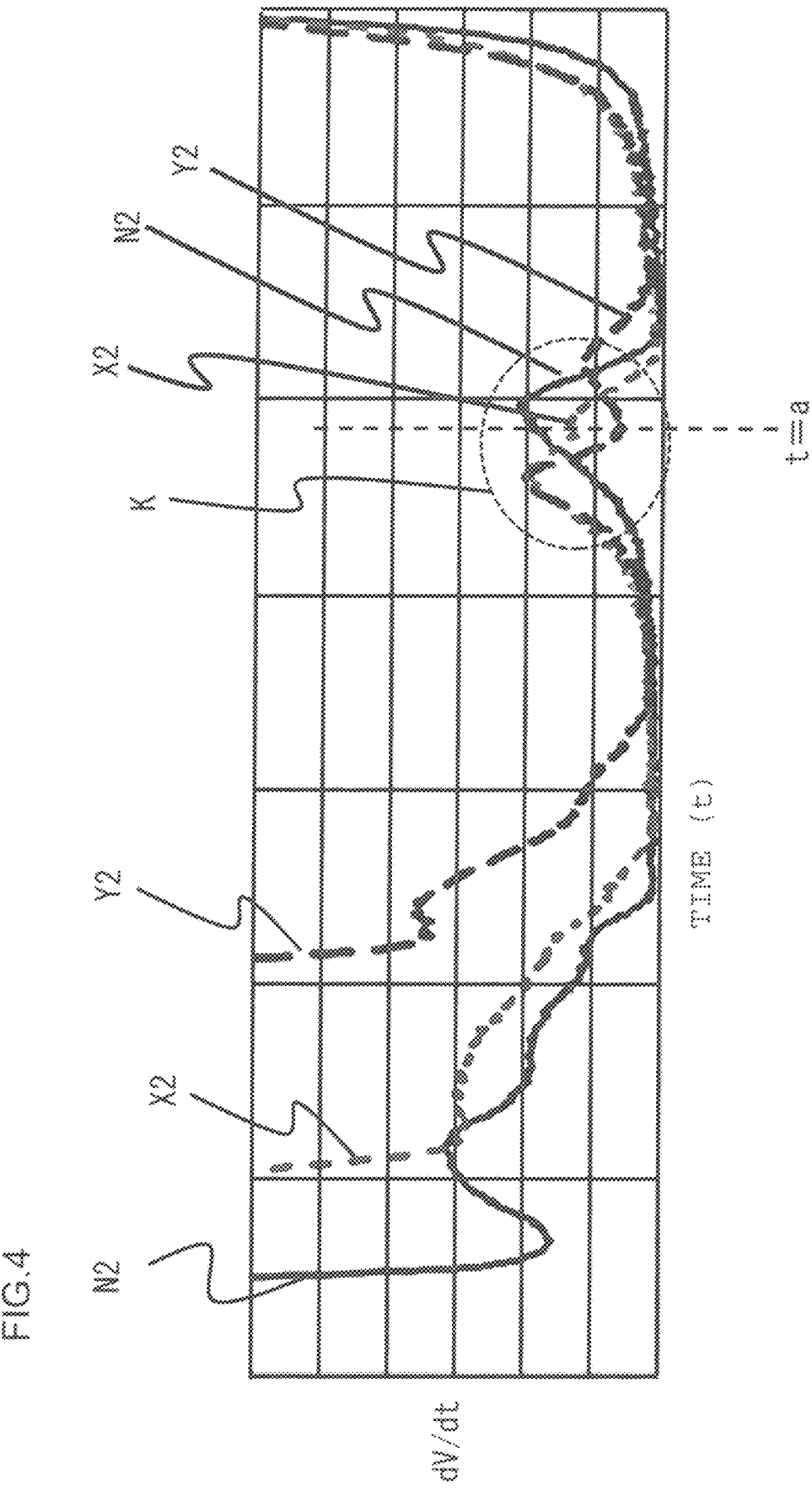
FIG. 4 is a diagram showing the relationship between time and a value dV/dt obtained by differentiating voltage with respect to time, according to embodiment 1.
Figure 5:
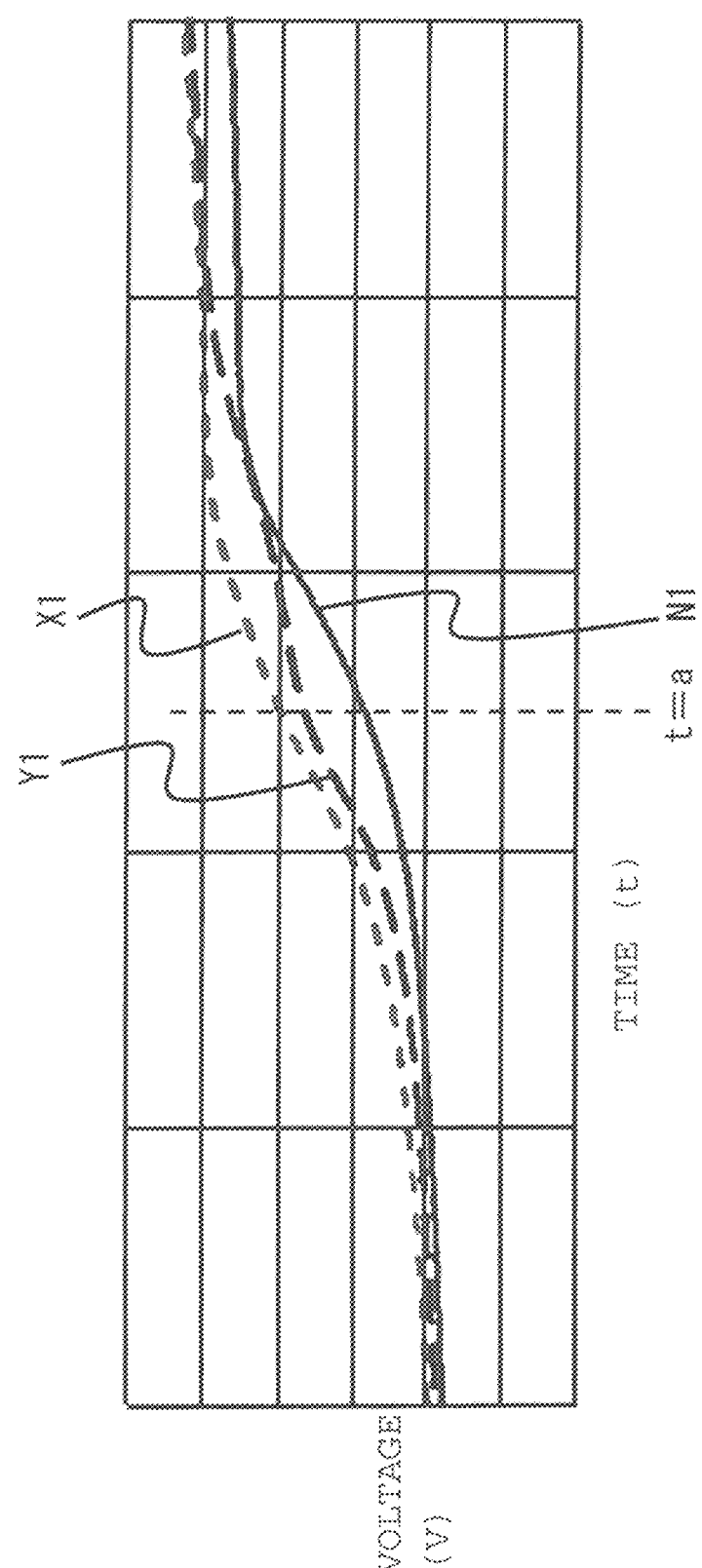
FIG. 5 is an enlarged view around a part in which voltage changes in a voltage flat part in FIG. 3.

In FIG. 3, a difference in level of a potential flat part appears around t=a, for all the numbers of charge-discharge cycles (see FIG. 5). In this storage battery, graphite is used as a negative electrode material, and it is inferred that the difference in level occurs due to structure change when reaction of lithium ions entering graphite progresses during charging. FIG. 4 shows the relationship between time (t) and a value (dV/dt) obtained by differentiating the voltage shown in FIG. 3 with respect to time (second), and this can represent the difference in level of the potential flat part more clearly. In FIG. 4, N2 indicates the relationship between dV/dt and time (t) in the case of the brand-new product, X2 indicates the relationship between dV/dt and time (t) in the case after X cycles, and Y2 indicates the relationship between dV/dt and time (t) in the case after Y cycles. By differential calculation as described above, it can be remarkably found that the difference in level (slope) occurs at a certain point of time.

It is found that, in FIG. 4, characteristic peaks K appear around t=a in which the difference in level of the potential flat part in FIG. 3 appears. Looking at the characteristic peaks K around t=a in FIG. 4, it is found that, although there is one peak for the case of the brand-new product (N2), there are two divided peaks for each of the case after X cycles (X2) and the case after Y cycles (Y2) in which more cycles have passed.

In the case of the brand-new product, it is considered that the electric capacity and the internal resistance of each of the single batteries cell1, cell2, cell3, cell4 composing the storage battery are uniform, and therefore all of dV/dt curves of the individual single batteries have the same shape and a dV/dt curve (N2) obtained from all voltage curves is the sum of the dV/dt curves of the individual single batteries. Regarding a dV/dt curve obtained from a terminal voltage curve of the plurality of single batteries after repetition of charge-discharge cycles and the like, deterioration of the storage battery progresses due to the repetition of charge-discharge cycles and the like, so that variations occur in the electric capacities and the internal resistances of the individual single batteries. Thus, the shapes of the dV/dt curves of the individual batteries of the storage battery have become no longer the same. And since a dV/dt curve obtained from the total voltage curves is the sum of the above dV/dt curves, the dV/dt curve (X2, Y2) obtained from the total voltage curves has a complicated shape as compared to that for the brand-new product (N2).

Figure 6:
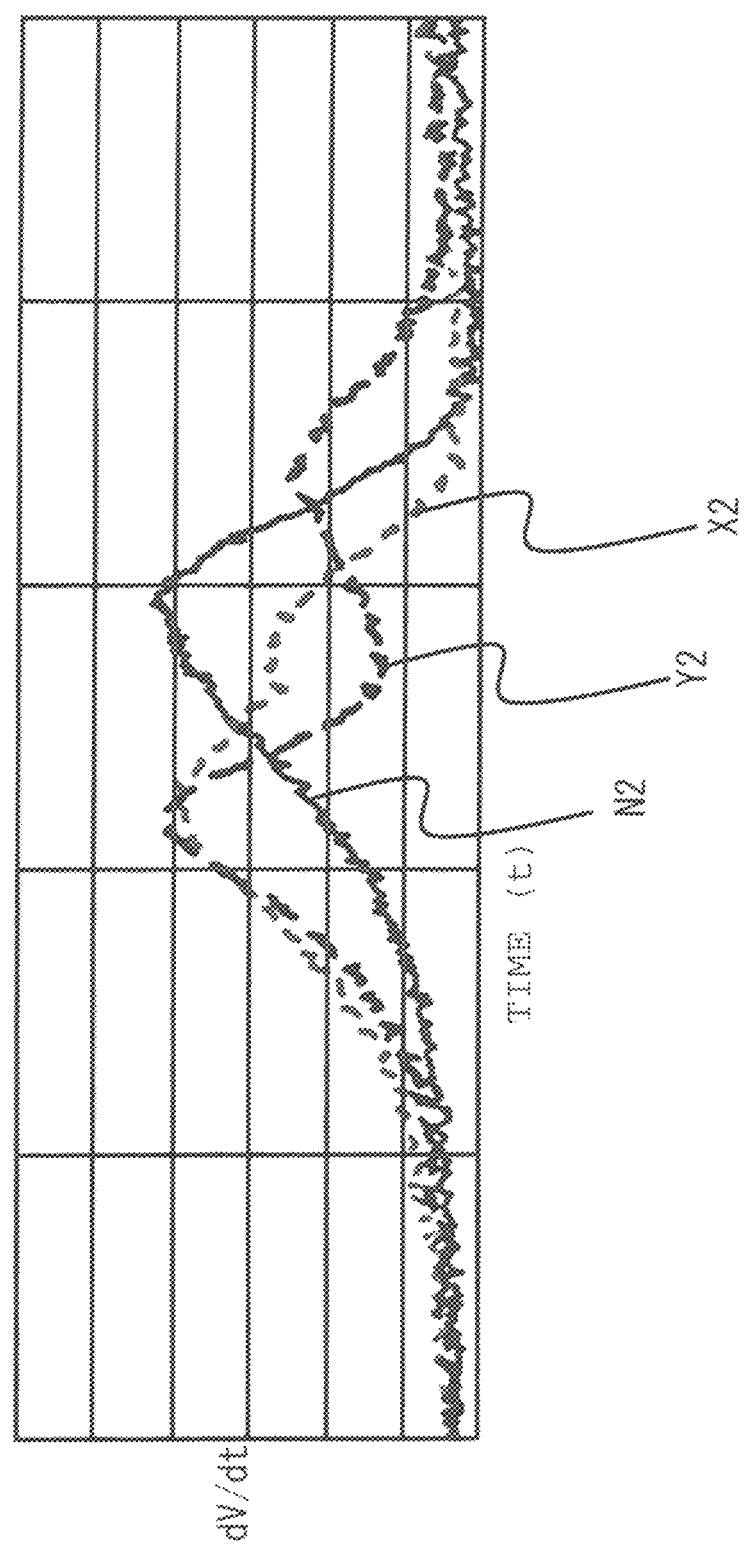
FIG. 6 is an enlarged view around peaks in FIG. 4.
Figure 7:
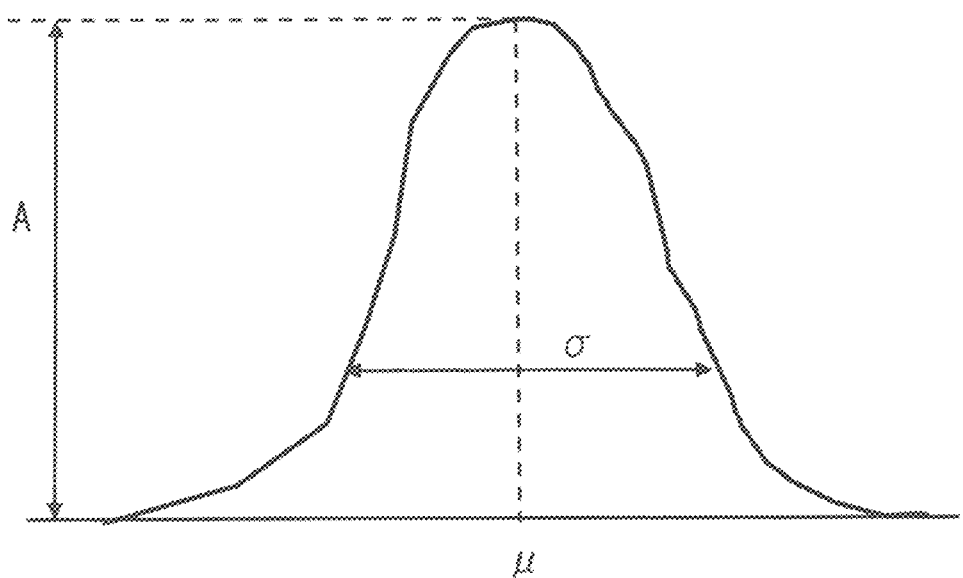
FIG. 7 is a waveform diagram showing a peak wave.

FIG. 5 is an enlarged view around t=a in FIG. 3, and clearly shows the difference in level of the potential flat part. It is found that the shape of voltage slightly changes as the number of charge-discharge cycles increases. FIG. 6 is an enlarged view around t=a in FIG. 4, and shows a part around the characteristic peak K in an enlarged manner. It can be confirmed that, although there is one peak for the case of the brand-new product (N2), there are two divided peaks for each of the case after X cycles (X2) and the case after Y cycles (Y2) in which more cycles have passed. The characteristic peak K obtained from the total voltage is separated into peaks for the respective single batteries. And an extent in which the medians of the peaks, the intensities (magnitudes) of the peaks, or the widths of the peaks for the single batteries have spread from those in the brand-new state is estimated. Whereby, reduction in soundness of the storage battery can be determined. FIG. 7 is a waveform diagram showing a peak wave. In FIG. 7, µ is the median of the peak calculated from a peak shape function, A is the intensity of the peak calculated from the peak shape function, and σ is the width of the peak calculated from the peak shape function. Hereinafter, also in FIG. 10 to FIG. 12, the median, the intensity, and the width of the peak are defined in the same manner as in FIG. 7.

Figure 8:
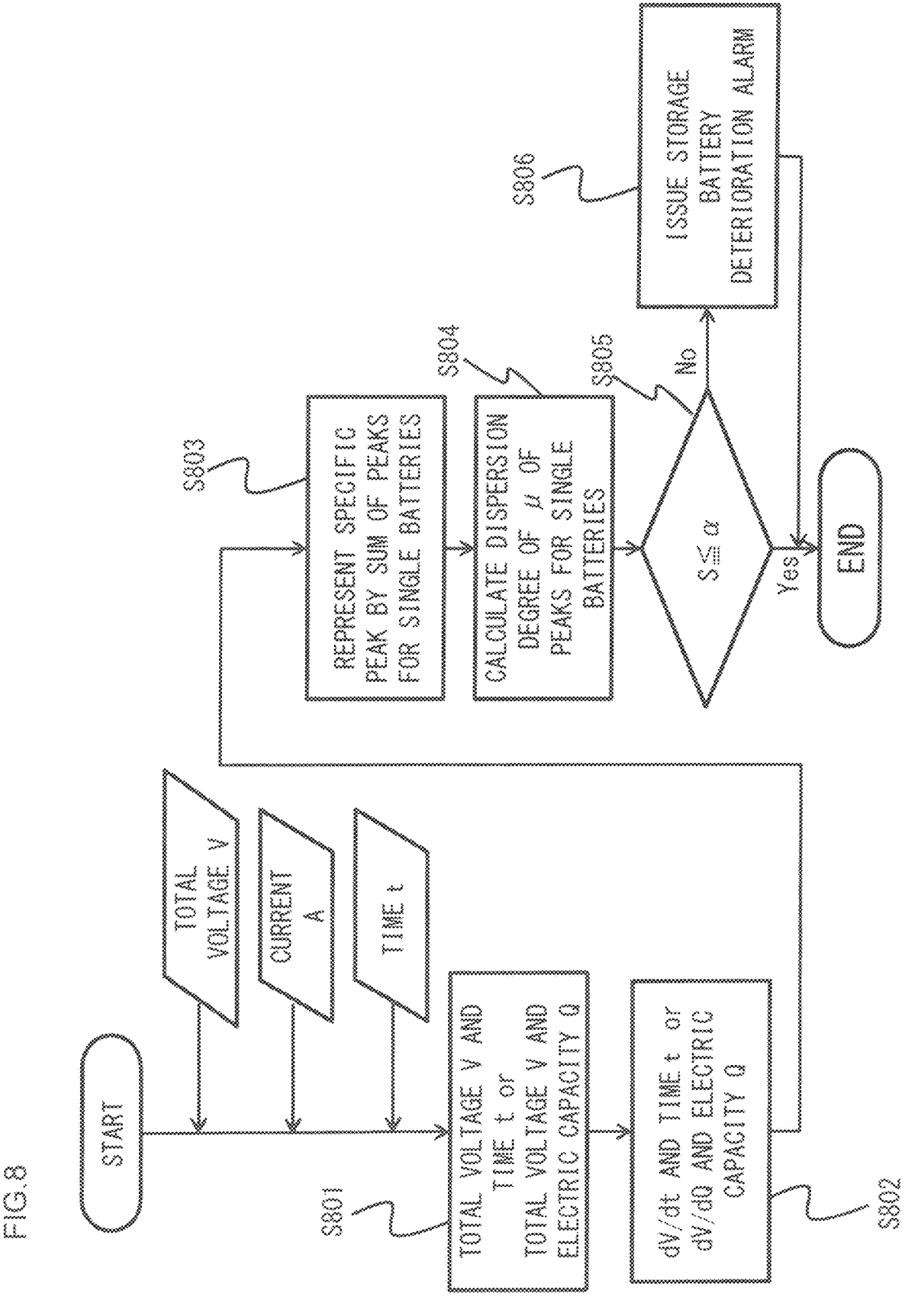
FIG. 8 is a flowchart showing a process for determining reduction in storage battery soundness according to embodiment 1.

FIG. 8 is a flowchart showing a process for determining reduction in storage battery soundness. The calculation device 4 takes in total voltage V, current A, and time t, and in step S801, plots the relationship between the total voltage V and the time t or the relationship between the total voltage V and an electric capacity Q. The electric capacity Q is calculated as current A×time t. In a case of performing charging at constant current, setting the time t on the horizontal axis results in the same meaning. Thus, the graph shown in FIG. 3 is obtained.

Next, in step S802, the total voltage V is differentiated with respect to the time t or the electric capacity Q, to generate a curve representing the relationship between dV/dt and the time t or the relationship between dV/dQ and the electric capacity Q. Thus, the graph shown in FIG. 4 is obtained. In a case of performing charging at constant current, it is possible to obtain dV/dt merely by recording change in the voltage value per set unit time without measuring the current, and either of the above methods may be selected.

Hereinafter, the relationship between the total voltage V and the electric capacity Q will be described.

A reaction equation for a lithium ion battery, in a case of charging as a general example, is as follows.

At a positive electrode, the following reaction occurs.

$$LiMO \rightarrow Li_{(1-x)}MO + xLi^+ + xe^-$$

M: metal element (e.g., Ni, Mn, Co, Fe)
O: oxygen, phosphoric acid, etc. (e.g., $O_2$, $PO_4$)
At a negative electrode, the following reaction occurs.

$$C + xLi^+ + xe^- \rightarrow Li_x C$$

In the entire battery, the following reaction occurs.

$$LiMO + C \rightarrow Li_{(1-x)}MO + Li_x C$$

The relationship between the battery voltage and the charging electric capacity Q in the lithium ion battery is obtained from the Nernst relationship. That is, the potential of the positive electrode is obtained by the following Expression (1).

[Numeral 1]

$$V_+ = V^0_{Li(1-x)MO} + \frac{RT}{nF} \ln \frac{[xLi^+][Li_{(1-x)}MO]}{[LiMO]} \tag{1}$$

The potential of the negative electrode is obtained by the following Expression (2).

[Numeral 2]

$$V_- = V^0_{Li_x C} + \frac{RT}{nF} \ln \frac{[xLi^+][C]}{[Li_x C]} \tag{2}$$

Here, R is a gas constant, T is a temperature (K), n is the number of electrons in reaction, and F is the Faraday constant.

Then, the battery voltage (=potential difference between the potential of the positive electrode and the potential of the negative electrode) is obtained by the following Expression (3).

[Numeral 3]

$$V = V_+ - V_- \tag{3}$$
$$= (V^0_{Li(1-x)MO} - V^0_{Li_x C}) + \frac{RT}{nF} \ln \frac{[Li_{(1-x)}MO]}{[LiMO]} \frac{[Li_x C]}{[C]}$$

Thus, V is represented by the following Expression (4).

[Numeral 4]

$$V = A + B \times \ln \frac{Q}{C} \tag{4}$$

Here, V is battery voltage, Q is the charging electric capacity, and A, B, and C are constants.

Then, V is represented by the following Expression (5).

[Numeral 5]

$$V = A + B \times \ln Q/C = f(Q) \tag{5}$$

Therefore, dV/dQ is calculated by the following Expression (6).

[Numeral 6]

$$\frac{dV}{dQ} = \lim_{h \to 0} \frac{f(Q+h) - f(Q)}{h} \tag{6}$$

In this way, dV/dQ is calculated.

As described above, the battery voltage V can be represented by a function of the charging electric capacity Q from the Nernst relationship. Here, dV/dQ represents the slope of V=f(Q) at a given value of Q. From dV/dQ calculated in this manner, the relationship between the total voltage V and the electric capacity Q is derived, whereby graphs corresponding to those in FIG. 3 to FIG. 6 are obtained in the same manner as the case of time t. In this case, the horizontal axis indicates the electric capacity Q instead of the time t.

Next, in step S803 in FIG. 8, one of the characteristic peaks K shown in FIG. 4 and FIG. 6 is selected and is represented by the sum of peaks for the single batteries composing the storage battery. FIG. 9 is a flowchart showing operations in step S803 and step S804 (described later) shown in FIG. 8. In step S901, the respective peak shapes of the constituent single batteries for the specific peak K are respectively estimated using a normal distribution expression, and the peak of the total voltage is estimated from the sum of them. Here, since four single batteries are connected in series, normal distribution expressions of the following Expressions (7) to (10) for the peaks of cell1, cell2, cell3, and cell4 are used. And the values of A, μ, and σ are set as variables, and Expression (11) representing the value of the sum for the four cells is calculated. Then, between Expression (11) and actual measured values of the total voltage, a least squares method is used to perform collation, and an approximation expression is obtained. Whereby A1, A2, A3, A4, μ1, μ2, μ3, μ4, σ1, σ2, σ3, σ4 are calculated and thus peaks fcell$_1$(t), fcell$_2$(t), fcell$_3$(t), and fcell$_4$(t) for the single batteries are estimated.

A peak f(t) for the storage battery is represented by the sum of the peaks fcell$_1$(t), fcell$_2$(t), fcell$_3$(t), and fcell$_4$(t) for the single batteries, as shown by the following Expressions (7) to (11). Here, μ1, μ2, μ3, μ4 are parameters regarding the medians of the peaks of the single batteries, A1, A2, A3, A4 are parameters regarding the intensities of the peaks, and σ1, σ2, σ3, σ4 are parameters regarding the widths of the peaks.

[Numeral 7]

$$fcell_1(t) = A_1 \exp\left[-\frac{(t-\mu_1)^2}{2\sigma_1^2}\right] \tag{7}$$

$$fcell_2(t) = A_2 \exp\left[-\frac{(t-\mu_2)^2}{2\sigma_2^2}\right] \tag{8}$$

$$fcell_3(t) = A_3 \exp\left[-\frac{(t-\mu_3)^2}{2\sigma_3^2}\right] \tag{9}$$

$$fcell_4(t) = A_4 \exp\left[-\frac{(t-\mu_4)^2}{2\sigma_4^2}\right] \tag{10}$$

$$f(t) = fcell_1(t) + fcell_2(t) + fcell_3(t) + fcell_4(t) \tag{11}$$

In the above description, the case of the time t has been described. However, calculation can be performed in the same manner for the electric capacity Q.

That is, in a case in which n single batteries cell1 to celln composing the storage battery are connected in series, a peak due to specific change in a storage battery voltage curve obtained by dV/dQ or dV/dt for respective single batteries is calculated. Then, by using peak shape functions of the following Expressions (12) to (n) for peaks for the respective single batteries cell1 to celln, A1 to An (intensities of peaks for single batteries), μ1 to μn (medians of peaks for single batteries), and σ1 to σn (widths of peaks for single batteries) are set as variables and collation is performed by a least squares method between an Expression (m) representing the value of the sum for the n single batteries and actual measured values of the total voltage, and an approximation expression is obtained. Thus, the peaks fcell1 to fcelln for the respective single batteries are estimated. A peak fbattery for the storage battery is represented by the sum of the peaks fcell1 to fcelln for the respective single batteries, as shown by the following Expression (m). By using this, the calculation device 4 analyzes the peak, whereby soundness of the storage battery can be diagnosed. In the following expression, x is a variable corresponding to the electric capacity Q or the time t.

$$fcell1 = f(x, A1, \mu1, \sigma1) \tag{12}$$

$$\vdots$$

$$fcelln = f(x, An, \mu n, \sigma n) \cdots (n)$$

$$fbattery = fcell + \cdots + fcelln \cdots (m)$$

Figure 10:
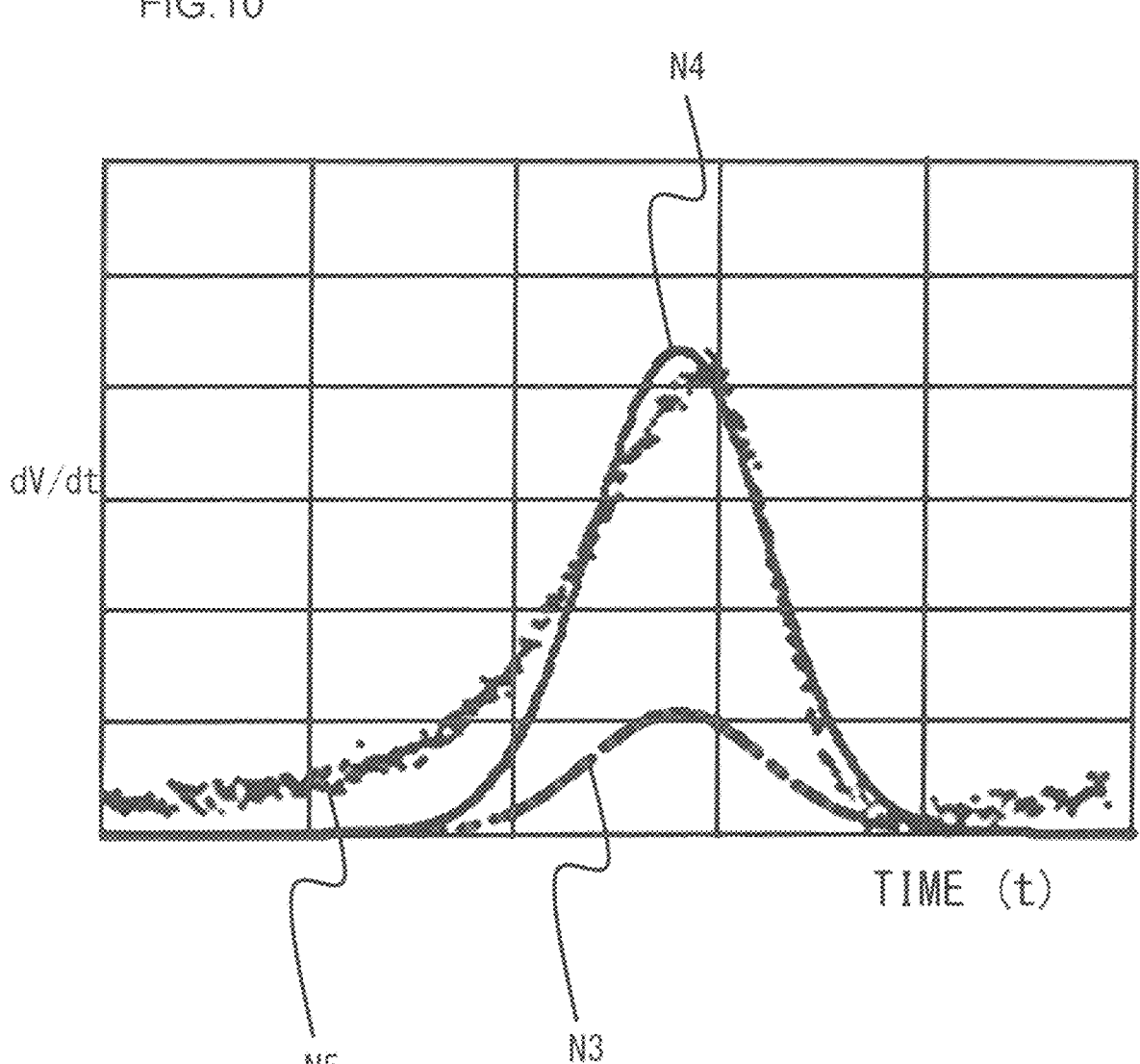
FIG. 10 is a diagram showing voltage change curves when charging was performed for a brand-new product in embodiment 1.

FIG. 10 shows voltage change curves when charging was performed for the brand-new product, and shows the relationship between the time t and dV/dt. In FIG. 10, regarding the characteristic peak of dV/dt around t=a, the peak for each of the single batteries composing the storage battery is estimated. Since FIG. 10 shows the case for the brand-new product, the electric capacities and the internal resistances of the four single batteries connected in series are uniform and therefore the dV/dt curve of the total voltage exhibits one peak. Thus, the peak shapes of the four single batteries can be estimated to be the same. That is, a curve N3 represents a dV/dt curve of each of the four single batteries, and all of the dV/dt curves of the four single batteries are represented by the same curve N3. A curve N4 is a curve obtained by summing curves for all the four single batteries. A curve N5 (collection of points) represents actual measured values.

Figure 11:
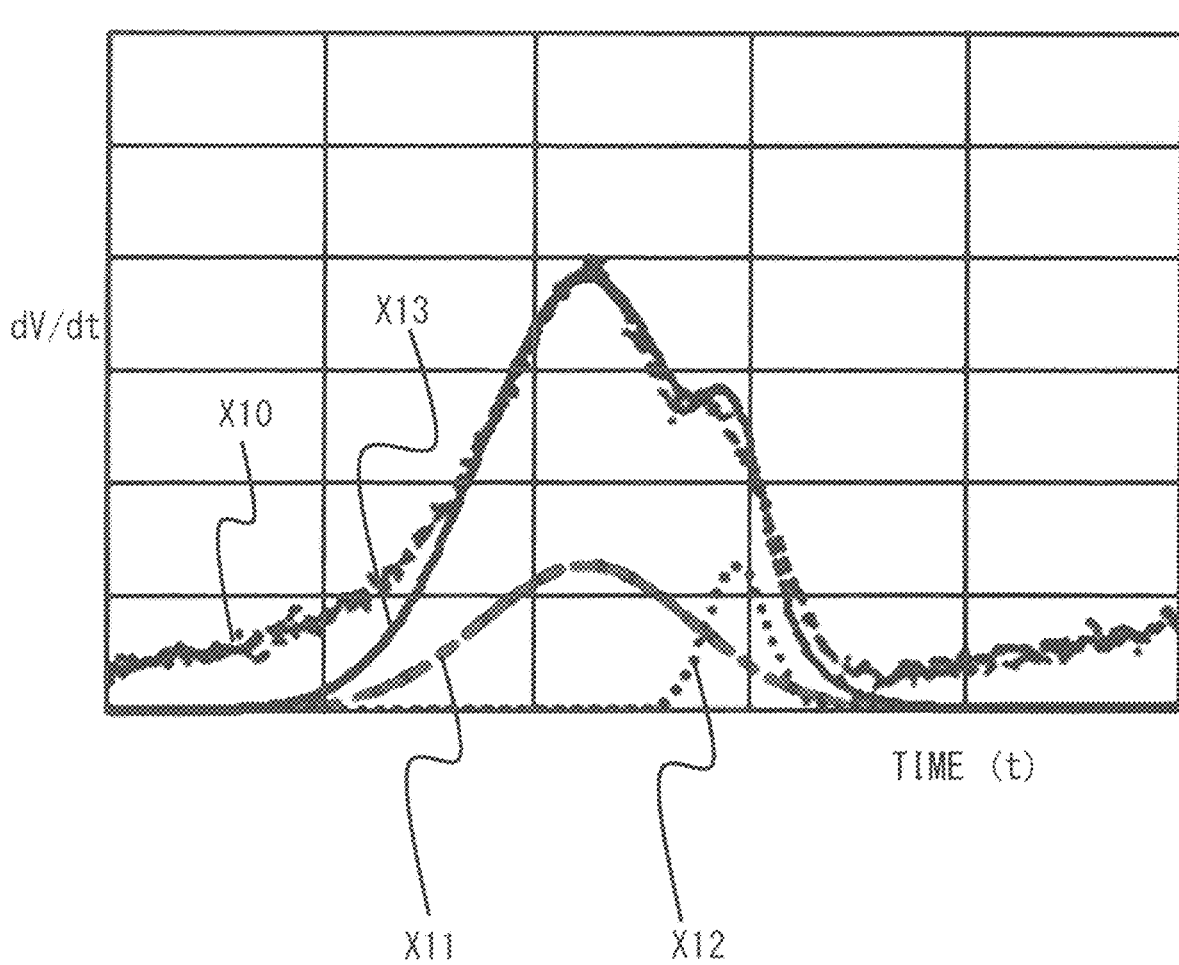
FIG. 11 is a diagram showing the relationship between time t and dV/dt after a charge-discharge cycle was performed for X cycles in embodiment 1.

FIG. 11 shows the relationship between the time t and dV/dt after a charge-discharge cycle was performed for X cycles. In FIG. 11, it is found that a peak shape of actual measured values X10 is slightly separated. The peaks for the respective single batteries were estimated, and an estimation result that the peak for one single battery cell4 was shifted from the other three single batteries cell1 to cell3 was obtained. That is, all of the dV/dt curves for the single batteries cell1 to cell3 are represented by X11, and they are the same. Meanwhile, the dV/dt curve for the single battery cell4 is represented by X12, and it is found that only one single battery exhibits a different dV/dt curve. A curve X13 is a curve obtained by summing curves for all the four single batteries cell1 to cell4. A curve X10 (collection of points) represents actual measured values. In such a case as shown in FIG. 11, only the single battery cell4 may be replaced.

Figure 12:
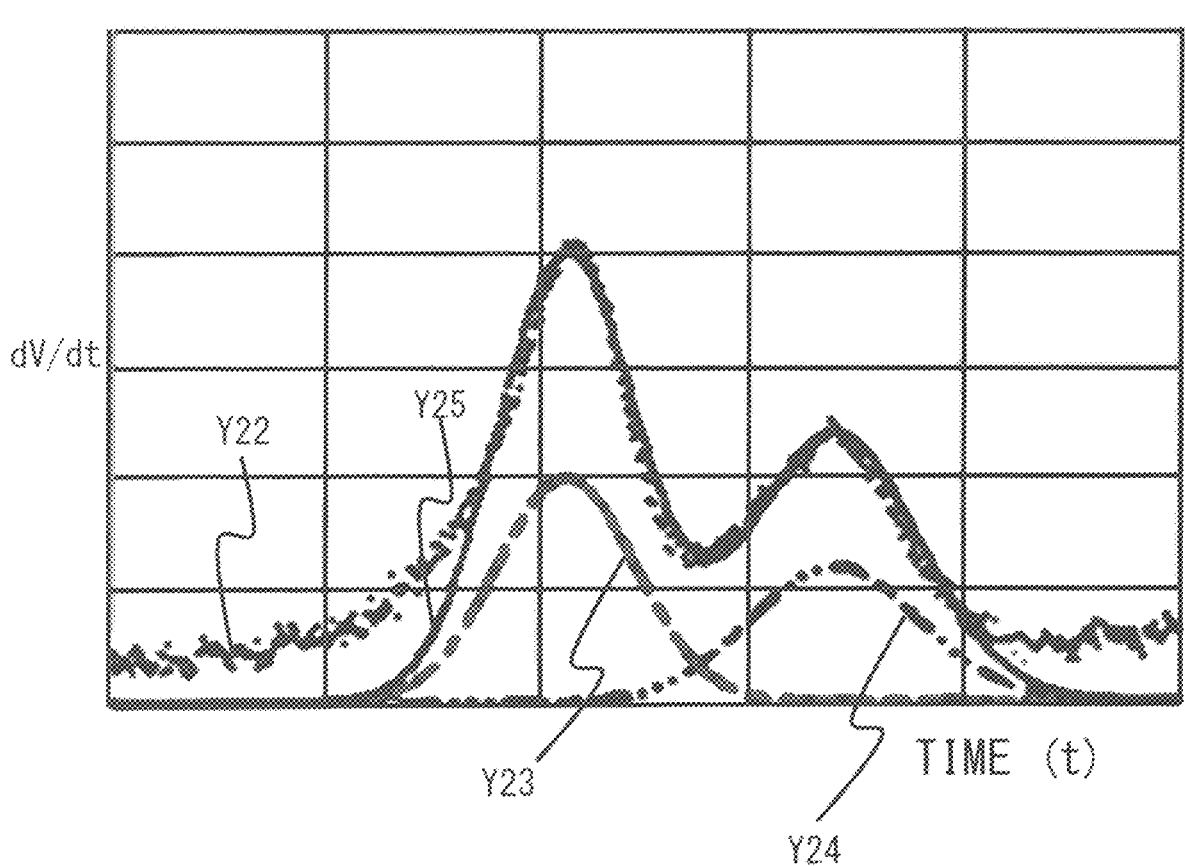
FIG. 12 is a diagram showing the relationship between time t and dV/dt after a charge-discharge cycle was performed for Y cycles in embodiment 1.

FIG. 12 shows the relationship between the time t and dV/dt after a charge-discharge cycle was performed for Y cycles. In FIG. 12, it is found that the peak of actual measured values Y22 is separated more greatly. The peaks for the respective single batteries were estimated, and an estimation result that there were separate peaks each corresponding to two single batteries was obtained. That is, a curve Y23 represents the dV/dt curves for the single batteries cell1 and cell3, and the curves for these two single batteries coincide with each other. Meanwhile, a curve Y24 represents the dV/dt curves for the single batteries cell2 and cell4, and the curves for these two single batteries coincide with each other. A curve Y25 represents the sum of the curve Y23 and the curve Y24.

Next, in step S804 in FIG. 8 and step S902 in FIG. 9, an index indicating the dispersion degree of the medians μ of the peaks, the intensities A of the peaks, or the widths σ of the peaks of the single batteries, is calculated. As the index indicating the dispersion degree, a difference between the maximum value and the minimum value, or a standard deviation S, is calculated as described in detail later. Hereinafter, a case of calculating the standard deviation S will be described.

Figure 13:
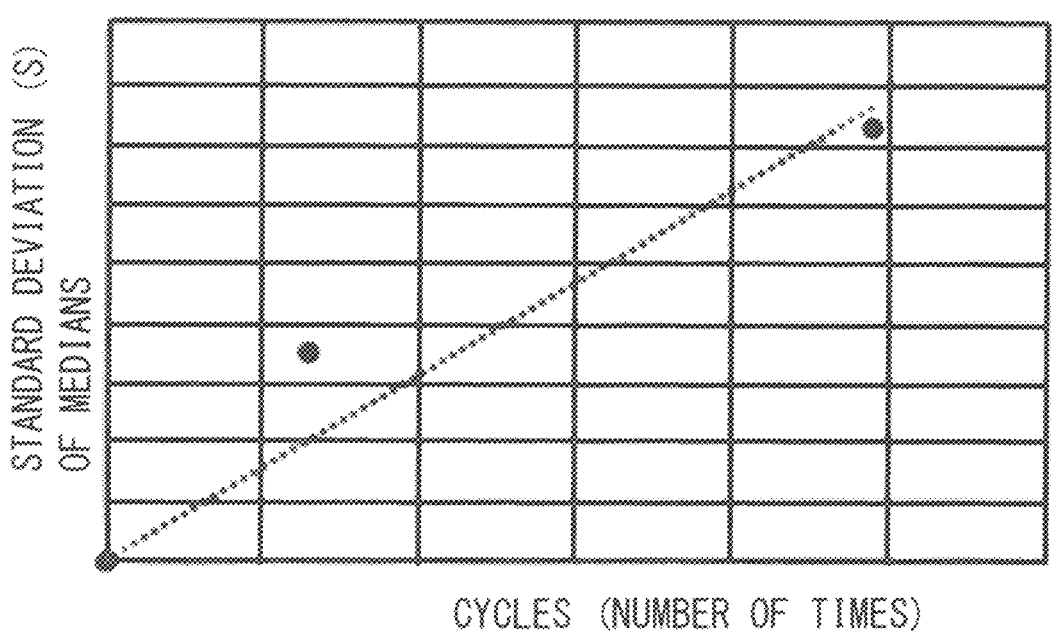
FIG. 13 is a diagram showing the relationship between the number of charge-discharge cycles and a standard deviation S in embodiment 1.

FIG. 13 shows the relationship between the number of charge-discharge cycles and the standard deviation S, in the case in which the standard deviation S is selected as the index for the dispersion degree among the single batteries about μ which means the median, out of the variables estimated from the peaks of the single batteries. The standard deviation S is calculated by the following Expression (13) (in this case, n=4).

[Numeral 8]

$$S = \sqrt{\frac{1}{n}\sum_{i=1}^{n}(\mu_i - \overline{\mu})2} \qquad (13)$$

Here, $\overline{\mu}$ is the average of the medians, and in this example, is represented as $\overline{\mu} = (\mu_1 + \mu_2 + \mu_3 + \mu_4)/4$.

In FIG. 13, it is shown that the standard deviation S of μ among the single batteries increases in accordance with increase in the number of charge-discharge cycles.

Next, in step S805, the standard deviation S as the index for the dispersion degree of the medians μ is compared with a storage battery deterioration determination reference value a prepared in advance. Then, in step S806, if S>α is satisfied, a storage battery deterioration alarm is issued by the display device 5. If S≤α is satisfied, the storage battery has not reached the deterioration determination reference yet and thus the determination operation is finished.

Figure 14:
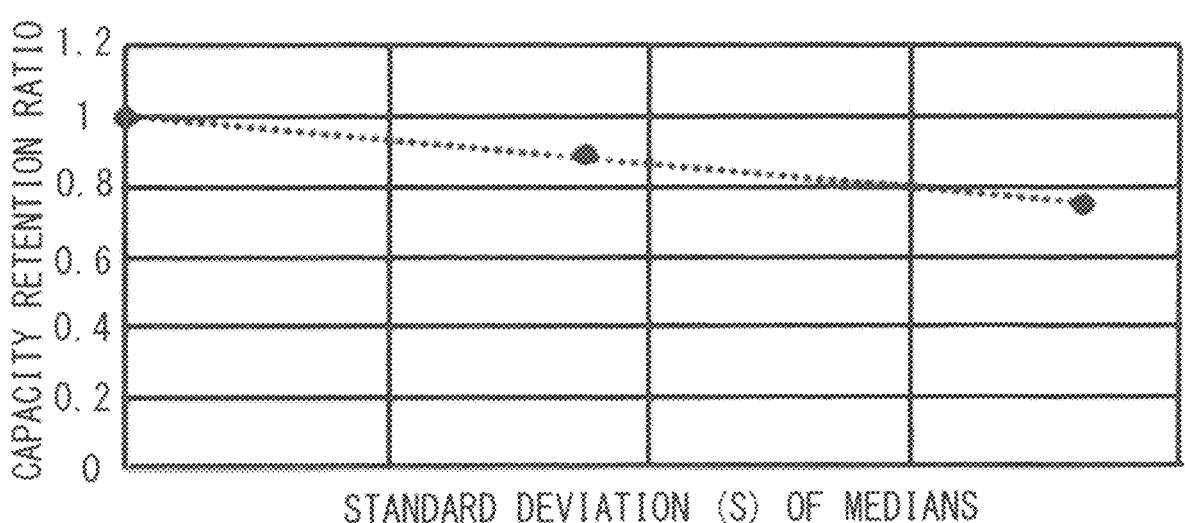
FIG. 14 is a diagram showing the relationship between a standard deviation S of medians among single batteries and a capacity retention ratio of the storage battery.

FIG. 14 shows the relationship between the standard deviation S among the single batteries about μ which means the median, and the capacity retention ratio of the storage battery (the amount of electricity discharged until reaching discharge end voltage in the case in which discharging is started from a charged state). It is shown that the capacity retention ratio decreases in accordance with increase in the standard deviation S.

Figure 15:
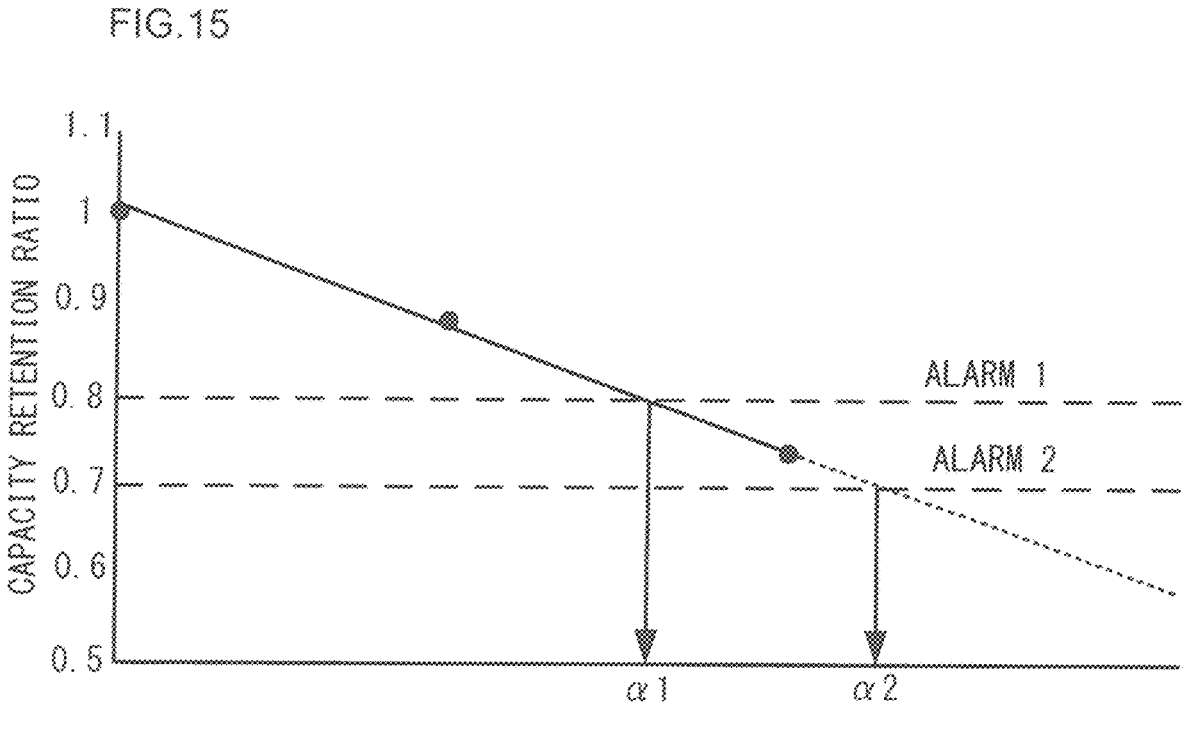
FIG. 15 is a diagram showing a case of diagnosing storage battery soundness on the basis of the relationship between the standard deviation among the single batteries and the capacity retention ratio of the storage battery.

FIG. 15 illustrates a case in which the relationship between the standard deviation S of the medians μ among the single batteries and the capacity retention ratio of the storage battery is prepared in advance and a standard deviation S corresponding to an allowable capacity retention ratio is decided in accordance with the usage purpose of the storage battery, whereby storage battery soundness is diagnosed. In this case, it is found that, when the standard deviation S of the medians has become α1, the capacity retention ratio becomes 0.8. Therefore, a storage battery deterioration determination reference value α1 is set and the display device 5 issues an alarm 1 when S>α1 is satisfied.

Depending on the usage purpose or the way of usage of the storage battery, for example, the number of times of reception of regenerative power to the storage battery or the number of times of output to a load may be decreased in accordance with the issued alarm 1, whereby the burden on the deteriorated storage battery can be reduced. Further, within a range permitted in terms of safety performance, a charging condition may be changed by raising the upper limit value for charge voltage or prolonging the charging period, for example, whereby the reduced capacity can be compensated. Such control is performed by the charge/discharge device 6.

It is found that, while the storage battery further continues to be used, when the standard deviation S of the medians has become α2, the capacity retention ratio becomes 0.7. Therefore, a storage battery deterioration determination reference value α2 is set and the display device 5 issues an alarm 2 when S>α2 is satisfied. When the alarm 2 is issued, the storage battery has been more deteriorated than when the alarm 1 was issued. Therefore, for example, the number of times of reception of regenerative power to the storage battery or the number of times of output to the load may be more decreased than when the alarm 1 was issued, whereby the burden on the more deteriorated storage battery can be reduced. In addition, it is possible to perform such control that, within a range permitted in terms of safety performance, a charging condition is changed by further raising the upper limit value for charge voltage or prolonging the charging period, for example, in order to compensate the reduced capacity. Such control is also performed by the charge/discharge device 6. Alternatively, in a case in which it is determined that a necessary capacity as a storage battery can not be ensured if the capacity retention ratio is reduced more and more, an operator may be notified to be urged to perform maintenance or replacement of the deteriorated storage battery.

The values α1 and α2 can be set in accordance with the performance of the storage battery or specifications required by an apparatus that uses the storage battery. In the above description, the case of performing determination on the basis of the median μ has been described. However, determination can be performed in the same manner also in a case of performing determination on the basis of the intensity A or the width σ.

The relationship between the number of charge-discharge cycles and the capacity retention ratio may be actually measured by measuring the capacity while a charge-discharge cycle is performed, in advance. Alternatively, the relationship may be estimated by using a deterioration prediction expression from capacity measurement data obtained by a predetermined number of initial charge-discharge cycles. For example, in a case in which it is found by measurement that the capacity is reduced on a 1% basis for every one cycle due to deterioration in initial 100 charge-discharge cycles, such a deterioration prediction expression that the capacity is deteriorated on a 1% basis for every one cycle also in the 101st and subsequent cycles, is established. Whereby estimation can be performed. Still alternatively, the relationship may be prepared by using data such as a catalog provided by a battery manufacturer.

As the index for the dispersion degree of the medians μ, a difference between the maximum value and the minimum value of the medians μ may be used. That is, as shown by the following Expression (14), ΔM may be calculated, and ΔM and a set value may be compared with each other in order to determine the dispersion degree.

$$\Delta M = M_{MAX} - M_{MIN} \qquad (14)$$

($M_{MAX}$ and $M_{MIN}$: the maximum value and the minimum value of the peak medians among cell1, cell2, cell3, and cell4)

Furthermore, as the index for the dispersion degree of the intensities A of the peaks, a difference between the maximum value and the minimum value of the intensities A may be used, as shown by the following Expression (15).

$$\Delta A = A_{MAX} - A_{MIN} \qquad (15)$$

($M_{MAX}$ and $A_{MIN}$: the maximum value and the minimum value of the peak intensities among cell1, cell2, cell3, and cell4)

Furthermore, as the index for the dispersion degree of the widths σ of the peak, a difference between the maximum value and the minimum value of the widths σ may be used, as shown by the following Expression (16).

$$\Delta\sigma = \sigma_{MAX} - \sigma_{MIN} \qquad (16)$$

($\sigma_{MAX}$ and $\sigma_{MIN}$: the maximum value and the minimum value of the peak widths among cell1, cell2, cell3, and cell4)

By the above configuration, it is possible to diagnose storage battery soundness. In the above example, a typical normal distribution expression (Gaussian function) is used as the peak shape function. However, depending on the peak shape, other peak shape functions (e.g., Lorentzian function, Gaussian-Lorentzian function, or Voigt function) may be selected. In the above description, the case of dV/dt has been described. However, analysis can be performed in the same manner also for dV/dQ.

As described above, a peak due to specific change in terminal voltage of a plurality of single batteries Obtained from dV/dQ or dV/dt of the terminal voltage of the plurality of single batteries can be separated for each of the single batteries composing the storage battery. Therefore, even in a case in which a plurality of single batteries are connected in series and it is impossible to measure the electric capacity or the internal resistance of each single battery individually, soundness can be diagnosed by the total voltage of the storage battery.

In the above embodiment, as shown in FIG. 3, peak analysis of dV/dt is performed by selecting a certain characteristic part from a voltage curve obtained when charging is performed from a fully discharged state to a fully charged state in the storage battery. In contrast, if a region in which a characteristic peak appears is confirmed in advance, a charging curve may be obtained only in the region in which the characteristic peak appears, whereby peak analysis can be performed by the same operation as described above. Thus, soundness of the storage battery can be diagnosed. In the case of the voltage curve in FIG. 3, if it is found by investigation in advance that a characteristic peak appears in dV/dt of the voltage curve around t=a, only the voltage curve on both sides around t=a may be obtained in order to obtain the peak of dV/dt. It is not necessary to perform charging over the entire region from a fully discharged state to a fully charged state in the storage battery, and thus the time to obtain necessary data for diagnosis of storage battery soundness can be shortened.

In the above embodiment, the diagnosing method in the case of using voltage change during charging has been described. However, also in a case of using voltage change during discharging, soundness of the storage battery can be diagnosed in the same manner. That is, in the case of charging, potential change unique to the electrode material due to structure change when reaction of lithium ions entering the graphite material of the negative electrode material progresses, is measured. On the other hand, in the case of discharging, in contrast to the case of charging, potential change due to structure change of the electrode material when reaction of lithium ions exiting the graphite material of the negative electrode material progresses, can be measured. Thus, soundness of the storage battery can be diagnosed in the same manner as described above.

Embodiment 2

In the above embodiment 1, soundness of the storage battery is diagnosed by using the parameter μ regarding the median of the peak. Alternatively, the parameter A regarding the intensity of the peak may be used. That is, in evaluating the standard deviation S indicating the dispersion degree of the values of the single batteries about the parameter A, the relationship with respect to increase in the number of charge-discharge cycles is investigated in advance, whereby soundness of the storage battery can be diagnosed in the same manner as described above. In this case, the standard deviation S is calculated by the following Expression (17) (in this case, n=4).

[Numeral 9]

$$S = \sqrt{\frac{1}{n}\sum_{i=1}^{n}(A_i - \overline{A})2} \tag{17}$$

Here, $\overline{A}$ is the average of the intensities, and in this example, is calculated as $\overline{A} = (A_1 + A_2 + A_3 + A_4)/4$.

Embodiment 3

In the above embodiments 1 and 2, soundness of the storage battery is diagnosed by using the parameter μ regarding the median of the peak or the parameter A regarding the intensity of the peak. Alternatively, the parameter σ regarding the width of the peak may be used. That is, in evaluating the standard deviation S indicating the dispersion degree of the values of the single batteries about the parameter σ, the relationship with respect to increase in the number of charge-discharge cycles is investigated in advance, whereby soundness of the storage battery can be diagnosed as described above. In this case, the standard deviation S is calculated by the following Expression (18) (in this case, n=4).

[Numeral 10]

$$S = \sqrt{\frac{1}{n}\sum_{i=1}^{n}(\sigma_i - \overline{\sigma})2} \tag{18}$$

Here, $\overline{\sigma}$ is the average of the widths, and in this example, is represented as $\overline{\sigma} = (\sigma_1 + \sigma_2 + \sigma_3 + \sigma_4)/4$.

As described above, in the storage battery diagnosing system according to the present disclosure, current and total voltage when a storage battery having a plurality of single batteries connected in series is charged or discharged are measured. And dV/dQ is obtained by differentiating with respect to a charging electric capacity, further curve of change in terminal voltage of the plurality of single batteries with respect to change in the charging electric capacity is calculated. Or dV/dt obtained by differentiating with respect to a charging time when charging is performed at constant current is calculated. On the basis of these values, a peak due to specific change in the terminal voltage curve of the plurality of single batteries is analyzed in order to diagnose soundness of the storage battery. The specific change in the terminal voltage curve of the plurality of single batteries is due to unique potential change that appears for each electrode material used in the storage battery. Depending on electrode material which is used, the depth of charge (or the state of charge (SOC)) at which potential change occurs, the magnitude of the change, and the like exhibit changes unique to each storage battery. Regarding the terminal voltage of the single batteries in the case in which the plurality of single batteries are connected in series, the sum of voltages of the individual single batteries is obtained.

Regarding the peak due to specific change in the terminal voltage curve of the plurality of single batteries obtained by dV/dQ or dV/dt, there is one peak when the storage battery is a brand-new product, but when soundness of the storage battery has changed by usage of the storage battery, the peak shape changes so as to become a complicated shape. The peak having a complicated shape obtained when soundness of the storage battery has changed is separated into peaks for the respective single batteries connected in series and composing the storage battery. And an extent in which the medians μ of the peaks, the intensities A of the peaks, or the widths σ of the peaks for the single batteries have spread from those in the brand-new state, is estimated. Thus, dispersions in performances of the single batteries composing the storage battery can be determined, whereby reduction in soundness of the storage battery can be determined.

By the above configuration, a peak shape for each single battery can be estimated by using a peak shape function on the basis of a peak obtained from dV/dQ or dV/dt calculated by using the terminal voltage curve of the plurality of single batteries composing the storage battery. And soundness of the storage battery can be diagnosed from the dispersion degree of the peak shape. Thus, it becomes possible to perform diagnosis more easily as compared to the conventional case.

Although the disclosure is described above in terms of various exemplary embodiments and implementations, it should be understood that the various features, aspects, and functionality described in one or more of the individual embodiments are not limited in their applicability to the particular embodiment with which they are described, but they can be applied, alone or in various combinations to one or more of the embodiments of the disclosure.

It is therefore understood that numerous modifications which have not been exemplified can be devised without departing from the scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE
CHARACTERS

1 storage battery
2 voltmeter
3 ammeter
4 calculation dev
5 display device

The invention claimed is:

1. A storage battery diagnosing system comprising:

an ammeter for measuring current when a storage battery having a plurality of single batteries connected in series is charged or discharged;

a voltmeter for measuring total voltage V of the storage battery; and a calculator which calculates dV/dt obtained by differentiating the total voltage with respect to time t on the basis of a relationship between the total voltage and charging time or discharging time, separates a characteristic peak obtained from a dV/dt curve into peaks for the respective single batteries, and diagnoses soundness of the storage battery on the basis of the separated peaks.

2. The storage battery diagnosing system according to claim 1, wherein the calculator compares medians, intensities, or widths of the peaks separated for the respective single batteries, with those for a brand-new storage battery, in order to diagnose soundness of the storage battery.

3. The storage battery diagnosing system according to claim 2, wherein in a case in which n single batteries are connected in series, n being an integer not less than 2, by using peak shape functions of Expressions 1 to n for the peaks for the respective single batteries, A1 to An which are intensities of the peaks for the respective single batteries, μ1 to μn which are medians of the peaks for the respective single batteries, and σ1 to σn which are widths of the peaks for the respective single batteries, are set as variables, and collation is performed by a least squares method between Expression m of a sum for the n single batteries and actual measured values of the total voltage in order to obtain an approximation expression, and the peaks for the respective single batteries are estimated by the approximation expression in order to diagnose soundness of the storage battery, $$fcell1 = f(x, A1, \mu1, \sigma1) \qquad \text{Expression 1}$$

$$\vdots$$

$$fcelln = f(x, An, \mu n, \sigma n) \cdots \text{Expression } n$$

$$fbattery = fcell1 + \cdots + fcelln \cdots \text{Expression } m$$

where x is a variable corresponding to time t.

4. The storage battery diagnosing system according to claim 3, wherein as an index indicating a dispersion degree of the medians, the intensities, or the widths among the single batteries, a standard deviation is used.

5. The storage battery diagnosing system according to claim 4, further comprising a display for displaying a diagnosis result, wherein the standard deviation is compared with a storage battery deterioration determination reference value prepared in advance, and when the standard deviation has become larger than the storage battery deterioration determination reference value, the displayer issues a storage battery deterioration alarm.

6. The storage battery diagnosing system according to claim 3, wherein as an index indicating a dispersion degree of the medians, the intensities, or the widths among the single batteries, a difference between a maximum value and a minimum value of the medians, the intensities, or the widths is used.

7. The storage battery diagnosing system according to claim 2, wherein as an index indicating a dispersion degree of the medians, the intensities, or the widths among the single batteries, a standard deviation is used.

8. The storage battery diagnosing system according to claim 7, further comprising a display for displaying a diagnosis result, wherein the standard deviation is compared with a storage battery deterioration determination reference value prepared in advance, and when the standard deviation has become larger than the storage battery deterioration determination reference value, the display issues a storage battery deterioration alarm.

9. The storage battery diagnosing system according to claim 2, wherein as an index indicating a dispersion degree of the medians, the intensities, or the widths among the single batteries, a difference between a maximum value and a minimum value of the medians, the intensities, or the widths is used.

\* \* \* \* \*